(12) United States Patent
Kumagai et al.

(10) Patent No.: US 8,670,053 B2
(45) Date of Patent: Mar. 11, 2014

(54) SOLID-STATE IMAGING DEVICE, MANUFACTURING METHOD OF SOLID-STATE IMAGING DEVICE AND ELECTRONIC APPARATUS

(71) Applicant: Sony Corporation, Tokyo (JP)

(72) Inventors: Yoshimichi Kumagai, Kanagawa (JP); Hiroaki Ishiwata, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/974,390

(22) Filed: Aug. 23, 2013

(65) Prior Publication Data

US 2013/0341748 A1    Dec. 26, 2013

Related U.S. Application Data

(62) Division of application No. 12/660,290, filed on Feb. 24, 2010, now Pat. No. 8,547,459.

(30) Foreign Application Priority Data

Mar. 4, 2009 (JP) .............................. P2009-050132

(51) Int. Cl.
*H04N 5/335* (2011.01)

(52) U.S. Cl.
USPC ........................................... 348/273; 438/69

(58) Field of Classification Search
USPC ................................ 348/273, 308; 438/69, 72
See application file for complete search history.

(56) References Cited

U.S. PATENT DOCUMENTS

| | | | |
|---|---|---|---|
| 6,903,395 B2 * | 6/2005 | Nakai et al. | 257/294 |
| 7,442,973 B2 | 10/2008 | Komoguchi et al. | |
| 7,488,615 B2 * | 2/2009 | Uya | 438/48 |
| 7,666,704 B2 * | 2/2010 | Suzuki et al. | 438/69 |
| 2005/0174552 A1 | 8/2005 | Takada et al. | |
| 2006/0220073 A1 * | 10/2006 | Kooriyama | 257/257 |
| 2008/0145965 A1 | 6/2008 | Reznik et al. | |
| 2008/0174688 A1 | 7/2008 | Okita et al. | |
| 2008/0265353 A1 | 10/2008 | Komoguchi et al. | |
| 2009/0127442 A1 | 5/2009 | Lee | |

FOREIGN PATENT DOCUMENTS

| | | | |
|---|---|---|---|
| JP | 2004 221532 A | 8/2004 | |
| JP | 2008-103757 A | 5/2008 | |

\* cited by examiner

*Primary Examiner* — Trung Diep
(74) *Attorney, Agent, or Firm* — Lerner, David, Littenberg, Krumholz & Mentlik, LLP

(57) ABSTRACT

A solid-state imaging device, includes: plural unit pixels including a photoelectric conversion portion converting incident light into an electrical signal, and a waveguide having a quadratic curve surface at an inner surface and introducing the incident light to the photoelectric conversion portion.

5 Claims, 8 Drawing Sheets

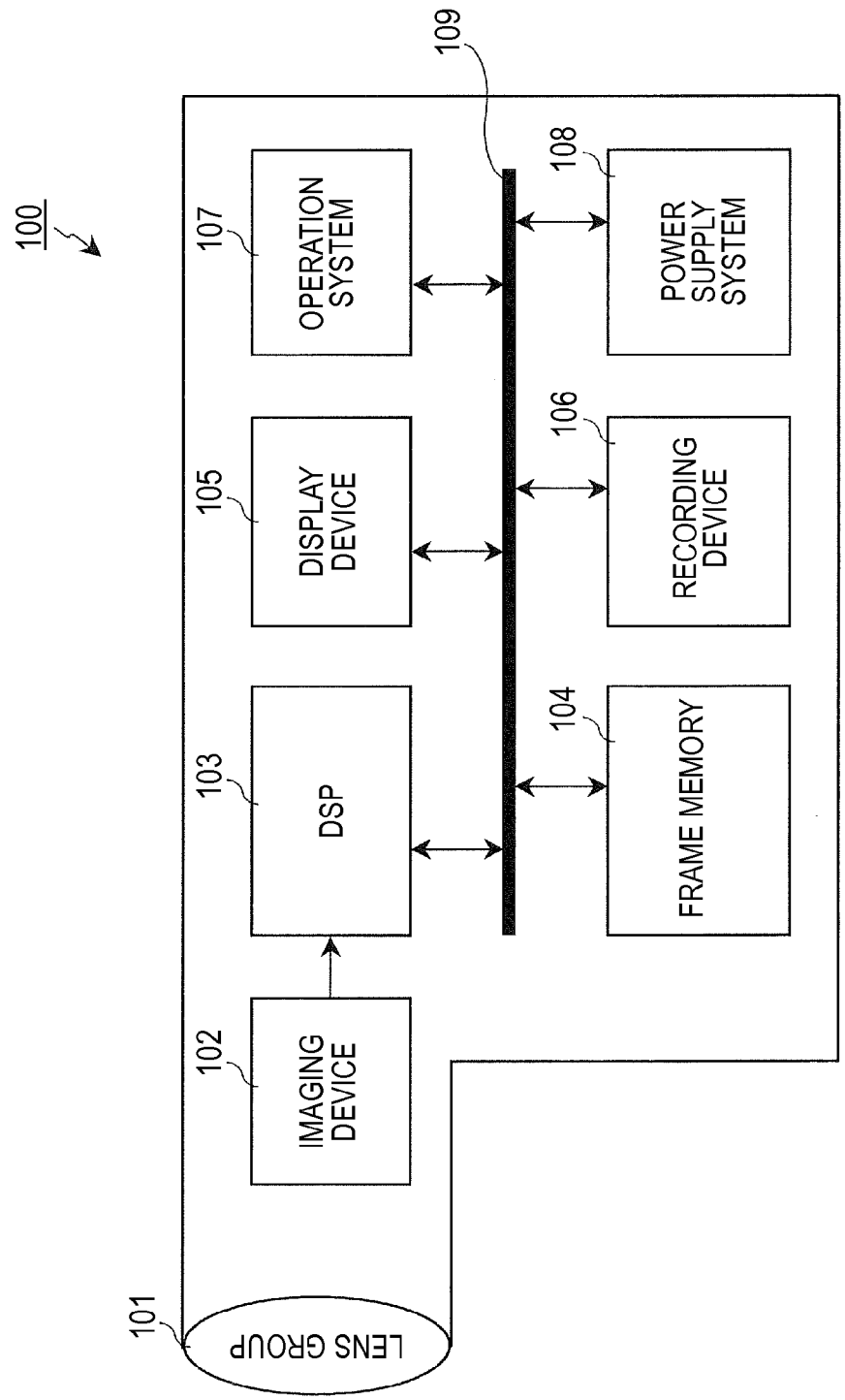

SOLID-STATE IMAGING DEVICE, MANUFACTURING METHOD OF SOLID-STATE IMAGING DEVICE AND ELECTRONIC APPARATUS

CROSS-REFERENCE TO RELATED APPLICATION

The present application is a divisional of U.S. patent application Ser. No. 12/660,290, filed Feb. 24, 2010, which claims priority from Japanese Patent Application No. JP 2009-050132 filed in the Japanese Patent Office on Mar. 4, 2009, all of which are incorporated herein by reference.

BACKGROUND OF THE INVENTION

1. Field of the Invention

The present invention relates to a solid-state imaging device, a manufacturing method of the solid-state imaging device and an electronic apparatus, and particularly relates to a solid-state imaging device having a waveguide structure, a manufacturing method of the waveguide structure and an electronic apparatus having the solid-state imaging device.

2. Description of the Related Art

A solid-state imaging device, for example, a CMOS-type solid-state imaging device (hereinafter, referred to as "CMOS image sensor") has a feature in which peripheral circuits such as a DSP (Digital Signal Processor) can be mounted on the same chip (substrate) by utilizing a CMOS process. When peripheral circuits are mounted on the same circuit, there is a case where a multilevel interconnection structure such as four-layered structure concerning wiring is used for reducing the scale of peripheral circuits.

However, since the distance between a substrate surface (silicon interface) to a micro lens (on-chip lens) is increased in the case where the multilevel interconnection structure is used, light condensing efficiency when light which is incident through the micro lens is condensed (introduced) on a light receiving surface of a light receiving portion (photoelectric conversion portion) is reduced. When the light condensing efficiency is reduced, pixel sensitivity is reduced.

Accordingly, a so-called waveguide structure is known, in which a waveguide is provided at the center of the pixel, thereby confining light within the waveguide to reduce the light amount loss in an optical path leading to the light receiving portion from the micro lens in order to increase the light condensing efficiency and to improve pixel sensitivity.

In related art, in order to introduce light to the light receiving portion more efficiently, a waveguide structure having a forward-tapered shape portion in which the size of a planer shape seen from a light incident direction is decreased gradually from a surface of the light incident side to the light receiving portion side is proposed (for example, refer to JP-A-2004-221532 (Patent Document 1). Moreover, a structure in which an aperture at an upper portion of the tapered shape portion (entrance side) of a tapered shape portion is largely opened to thereby increase the incident light amount as compared with the waveguide structure described in Patent Document 1 is proposed (for example, refer to JP-A-2008-103757 (Patent Document 2)).

SUMMARY OF THE INVENTION

In cases of the waveguide structures described in Patent Documents 1, 2, light can be condensed on the light receiving surface of the light receiving portion efficiently by the action of the tapered shape portion, however, light obtained when light perpendicular to the light receiving surface (light incident in parallel to the central axis of the waveguide) is reflected on the tapered surface of the waveguide is not considered. That is, it is difficult to condense light reflected in the waveguide on the light receiving surface of the light receiving portion in the structure.

In view of the above, it is desirable to provide a solid-state imaging device which can efficiently condense light including light incident in parallel to the central axis of the waveguide on the light receiving portion (photoelectric conversion portion), a manufacturing method of the waveguide structure and an electronic apparatus having the solid-state imaging device.

According to an embodiment of the invention, in a solid-state imaging device having plural unit pixels including a photoelectric conversion portion converting incident light into an electrical signal and a waveguide introducing the incident light to the photoelectric conversion portion, an inner surface of the waveguide is a quadratic curve surface.

Since the inner surface of the waveguide is the quadratic curve surface in the solid-state imaging device having the above structure, particularly when light incident in parallel to the central axis of the waveguide (parallel light) is reflected on the quadratic curve surface, the light is efficiently condensed to the photoelectric conversion portion due to characteristics included in the quadratic curve surface, as a result, light condensing efficiency is increased.

According to embodiments of the invention, particularly, light incident in parallel to the central axis of the waveguide can be efficiently condensed to the photoelectric conversion portion and light condensing efficiency can be increased, therefore, the sensitivity can be improved.

BRIEF DESCRIPTION OF THE DRAWINGS

FIG. 10 is a block diagram showing a configuration example of an imaging apparatus which is an example of an electronic apparatus according to an embodiment of the invention.

DETAILED DESCRIPTION OF THE INVENTION

Hereinafter, best modes for carrying out the invention (hereinafter, written as "embodiments") will be explained in detail with reference to the drawings. The explanation will be made in the following order.

1. Solid-state imaging device to which the invention is applied (an example of a CMOS image sensor)
2. First Embodiment (an example in which a waveguide inner surface is a parabolic surface)
3. Second Embodiment (an example in which a waveguide inner surface is an elliptical surface)
4. Modification example
5. Application example (imaging apparatus)

1. Solid-State Imaging Device to which the Invention is Applied

[System configuration]

Figure 1:
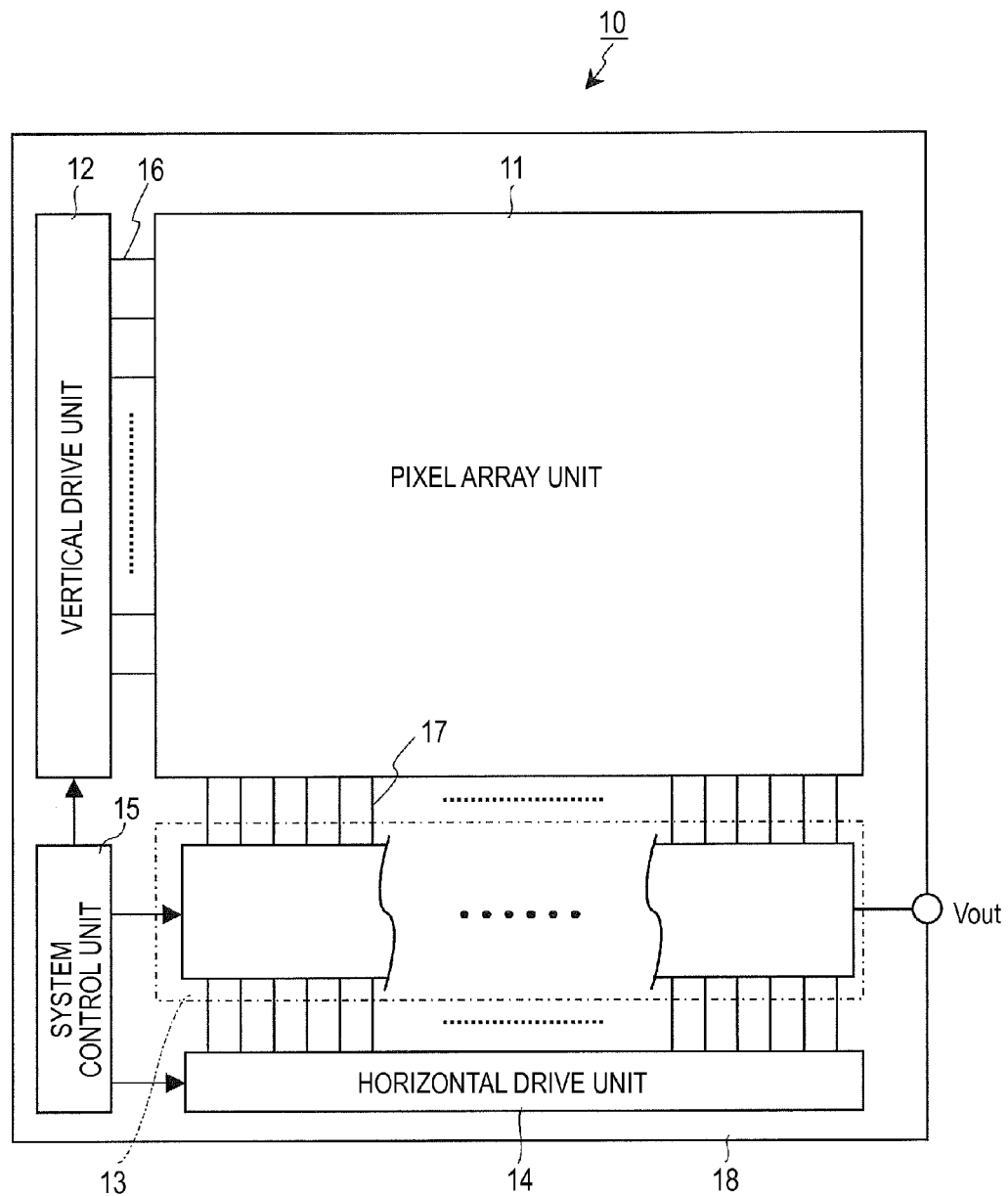
FIG. 1 is a system configuration view showing an outline of a configuration of a CMOS image sensor to which the invention is applied.

FIG. 1 is a system configuration view showing an outline of a configuration of a solid-state imaging device, for example, a CMOS image sensor which is a type of an X-Y address type solid-state imaging device to which the invention is applied. Here, the CMOS image sensor is an image sensor formed by applying or partially using a CMOS process.

As shown in FIG. 1, a CMOS image sensor 10 according to the application example includes a pixel array unit 11 formed on a semiconductor substrate (chip) 18 and peripheral circuit units integrated on the same semiconductor substrate 18 as the pixel array unit 11. As the peripheral circuits, for example, a vertical drive unit 12, a column processing unit 13, a horizontal drive unit 14 and a system control unit 15 are provided.

In the pixel array unit 11, not-shown unit pixels (hereinafter, they may be written as merely "pixels") including photoelectric conversion units (for example, photodiodes) which photoelectrically convert incident visible light into the charge amount corresponding to the light amount are two-dimensionally arranged in a matrix state. Each pixel is provided with a lens for condensing incident light, namely, a so-called micro lens, a color filter in the case of color display and the like though not shown. A specific configuration of the unit pixel will be described later.

In the pixel array unit 11, pixel drive lines 16 are formed along the right and left direction in the drawing (pixel arrangement direction of pixel rows/horizontal direction) with respect to respective rows in the pixel arrangement of the matrix state, and vertical signal lines 17 are formed along the up and down direction in the drawing (pixel arrangement direction of pixel columns/vertical direction) with respect to respective columns. In FIG. 1, only one pixel drive line 16 is shown, however, it is not limited to one line. An end of the pixel drive line 16 is connected to an output end corresponding to each row of the vertical drive unit 12.

The vertical drive unit 12 includes a shift register, an address decoder and the like. The vertical drive unit 12 includes a read scanning system and a sweep scanning system though specific configurations thereof are not shown here. The read scanning system sequentially performs selective scanning of unit pixels from which signals are read row by row.

On the other hand, the sweep scanning system performs sweep scanning which sweeps (resets) unnecessary charges from the photoelectric conversion elements of unit pixels in a reading row to which reading scanning is performed by the read scanning system preceding the read scanning by a period of time corresponding to shutter speed. A so-called electronic shutter operation is performed by the sweeping (resetting) of unnecessary charges by the sweep scanning system. The electronic shutter operation means operations of sweeping photoelectric charges of the photoelectric conversion elements and newly starting exposure (starting accumulation of photoelectric charges).

A signal read by the reading operation by the read scanning system corresponds to the light amount which has been incident after the immediately preceding reading operation or the electronic shutter operation. A period from the read timing by the immediately preceding reading operation or the sweep timing by the immediately preceding electronic shutter operation until the read timing by the reading operation at this time will be an accumulation time (exposure time) of photoelectric charges in the unit pixel.

Signals outputted from respective unit pixels of the pixel rows selectively scanned by the vertical drive unit 12 are supplied to the column processing unit 13 through respective vertical signal lines 17. The column processing unit 13 performs predetermined signal processing to analog pixel signals outputted from respective pixels 20 in the selected rows by each pixel column in the pixel array unit 11.

As the signal processing in the column processing unit 13, for example, a CDS (Correlated Double Sampling) processing is cited. The CDS processing is processing in which reset levels and signal levels outputted from respective pixels of the selected row and taking the difference of these levels to thereby obtain pixel signals of one row and remove fixed pattern noise of pixels. An AD conversion function which digitalizes analog pixel signals can be also included in the column processing unit 13.

The horizontal drive unit 14 includes a shift register, an address decoder and the like, sequentially performing selective scanning circuit portions corresponding to pixel columns of the column processing unit 13. According to the selective scanning by the horizontal drive unit 14, pixel signals processed in the column processing unit 13 by each pixel column are sequentially outputted.

The system control unit 15 receives clocks given from the outside of the semiconductor substrate 18, data instructing operation modes and the like, and further outputs data such as internal information of the CMOS image sensor 10. The system control unit 15 further includes a timing generator which generates various timing signals, performing drive control of the vertical drive unit 12, the column processing unit 13 and the horizontal drive unit 14 and the like based on various timing signals generated by the timing generator.

[Circuit Configuration of the Unit Pixel]

Figure 2:
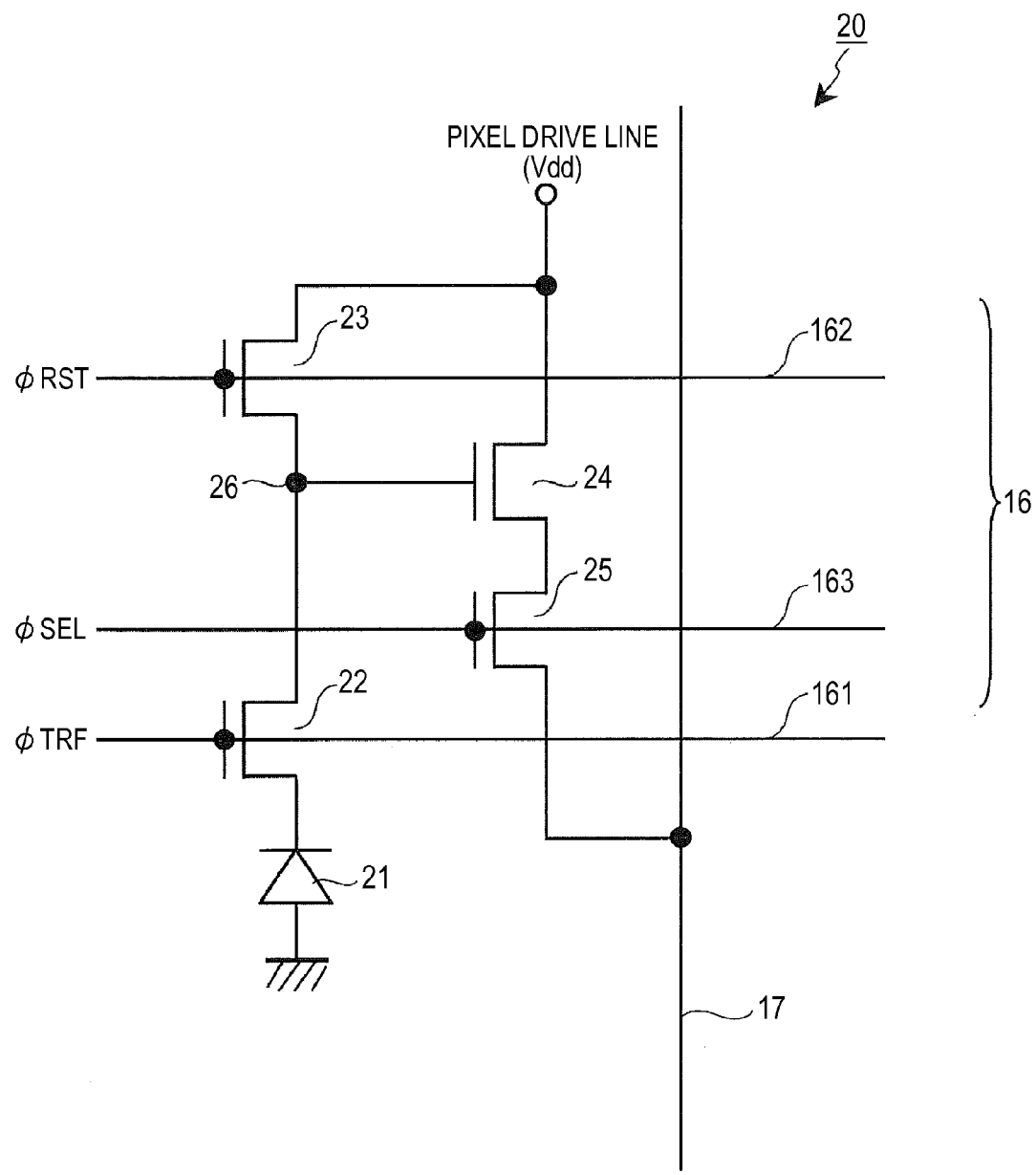
FIG. 2 is a circuit diagram showing an example of a circuit configuration of a unit pixel.

FIG. 2 is a circuit diagram showing an example of the unit pixel 20. As shown in FIG. 2, the unit pixel 20 according to the circuit example includes four transistors, for example, a transfer transistor 22, a reset transistor 23, an amplification transistor 24 and a selection transistor 25, in addition to a photodiode 21 which is an example of the photoelectric conversion unit.

In this case, as four transistors 22 to 25, for example, an N-channel MOS transistor is used. However, the combination of conductive types in the transfer transistor 22, the reset transistor 23, the amplification transistor 24 and the selection transistors 25 which are cited here is just an example, and it is not limited to the combination.

As the pixel drive line 16, for example, three drive wires of a transfer line 161, a reset line 162 and a selection line 163 are provided with respect to each pixel in the same pixel row in common in the unit pixel 20. Respective ends of the transfer line 161, the reset line 162 and the selection line 163 are connected to output ends corresponding to each pixel row of the vertical drive unit 12 by each pixel row.

The photodiode 21 is connected to a negative-side power supply (for example, a ground) at an anode electrode, photoelectrically converts received light into photoelectric charges (photoelectrons, in this case) of the charge amount corresponding to the light amount and accumulates the photoelectric charges. A cathode electrode of the photodiode is electrically connected to a gate electrode of the amplification transistor 24 through the transfer transistor 22. A node 26 which is electrically connected to the gate electrode of the amplification transistor 24 is called a FD (floating diffusion) portion.

The transfer transistor 22 is connected between the cathode electrode and the FD portion 26 of the photodiode 21. To a gate electrode of the transfer transistor 22, a transfer pulse φTRF in which the high level (for example, Vdd level) is active (hereinafter, written as "High active") is given through the transfer line 161. According to this, the transfer transistor 22 becomes ON state and transfers photoelectric charges which have been photoelectrically converted by the photodiode 21 to the FD portion 26.

The reset transistor 23 is connected to a pixel power supply Vdd at a drain electrode and connected to the FD portion 26 at a source electrode, respectively. To a gate electrode of the reset transistor 23, a high-active reset pulse φRST is given through a reset line 162. According to this, the reset transistor 23 becomes ON state and resets the FD portion 26 by sweeping charges in the FD portion 26 to the pixel power supply Vdd before signal charges are transferred from the photodiode 21 to the FD portion 26.

The amplification transistor 24 is connected to the FD portion 26 at a gate electrode and connected to the pixel power supply Vdd at a drain electrode, respectively. The amplification transistor 24 outputs a potential of the FD portion 26 after being reset by the reset transistor 23 as a reset signal (reset level) Vreset. The amplification transistor 24 further outputs the potential of the FD portion after the transfer of signal charges by the transfer transistor 22 is outputted as a light accumulation signal (signal level) Vsig.

The selection transistor 25 is connected to a source electrode of the amplification transistor 24 at a drain electrode and connected to the vertical signal line 17 at a source electrode. To a gate electrode of the selection transistor 25, a high-active selection pulse φSEL is given through a selection line 163. According to this, the selection transistor 25 becomes ON state and relays signals outputted from the amplification transistor 24 to the vertical signal line 17 with the unit pixel 20 as a selection state.

The selection transistor 25 can apply a circuit configuration of being connected between the pixel power supply Vdd and the drain of the amplification transistor 24.

The unit pixel 20 is not limited to the pixel configuration including four transistors in the above configuration. For example, a pixel configuration including three transistors in which the amplification transistor 24 doubles as the selection transistor 25 can be applied and any pixel circuit configuration can be used.

The CMOS image sensor 10 according to the application example of the invention explained as the above includes a waveguide structure in which a waveguide is provided at the center of the pixel in order to introduce light incident on each pixel 20 efficiently into the photodiode 21 (namely, to increase light condensing efficiency).

According to an embodiment of the invention, the CMOS image sensor 10 having the waveguide structure can further improve the light condensing efficiency at the time of introducing light incident through the micro lens to a light receiving surface of the photodiode 21. A specific embodiment of the waveguide structure for improving the light condensing efficiency will be explained as follows.

2. First Embodiment

[Pixel Structure]

Figure 3:
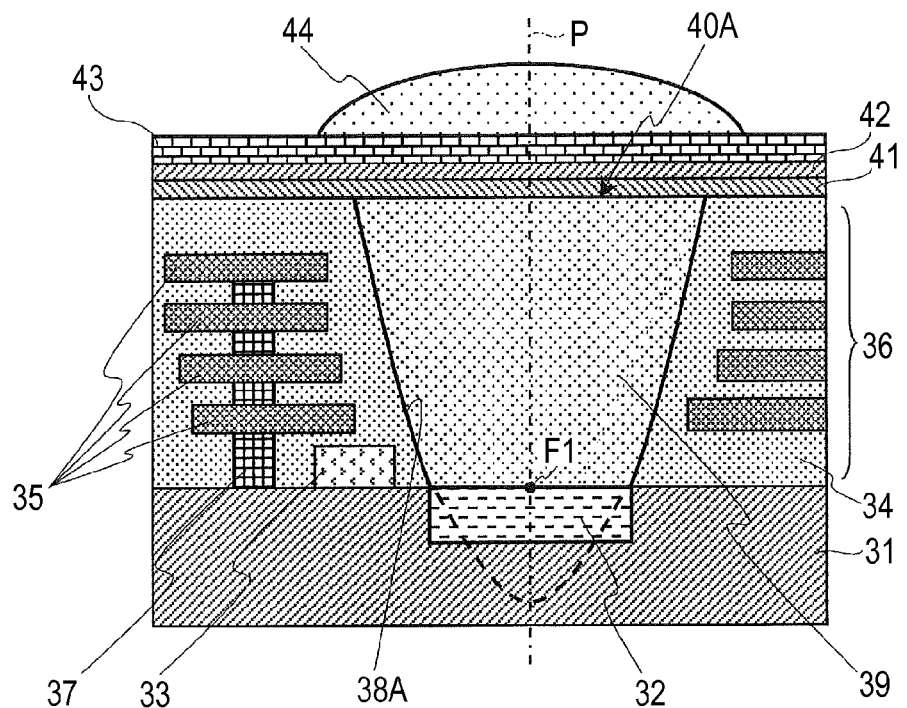
FIG. 3 is a cross-sectional view showing a cross-sectional structure of a pixel having the waveguide structure according to a first embodiment of the invention.

FIG. 3 is a cross-sectional view showing a cross-sectional structure of a pixel having the waveguide structure according to a first embodiment of the invention.

In FIG. 3, a photoelectric conversion portion (light receiving portion) 32 which photoelectrically converts incident light is formed on a surface layer portion of a semiconductor substrate corresponding to the semiconductor substrate 18 of FIG. 1, for example, a silicon substrate 31. The photoelectric conversion portion 32 is formed as a diode (corresponding to the photodiode 21 in FIG. 2) including, for example, a P-type diffusion layer and an N-type diffusion layer on the substrate surface side of the P-type diffusion layer. The photoelectric conversion portion 32 may have a structure in which the surface thereof is further covered by a hole accumulation layer including the P-type diffusion layer.

A gate electrode 33 of the pixel transistor such as the transfer transistor 22 is formed through a base insulating film (not shown) and an interlayer insulating film 34 is deposited on the silicon substrate 31. On the surface side of the interlayer insulating film 34, wirings 35 are formed by burying a conductive material in groove patterns. The deposition of the interlayer insulating film 34 and the formation of wiring 35 are repeated, then, the interlayer insulating film 34 is finally formed to thereby form a multilevel interconnection layer 36.

In the multilevel interconnection layer 36, the wirings 35 at respective layers are electrically connected through a contact portion 37 appropriately. At a portion above the photoelectric conversion portion 32 in the multilevel interconnection layer 36, a hole for the waveguide 38A is formed with a parabolic surface (paraboloid). A light transmissive buried layer (transparent film) 39 is buried inside the hole 38A to form a waveguide 40A. Here, the waveguide 40A is formed by the transmissive buried layer 39 being buried in the hole 38A formed with the barabolic surface, therefore, an inner surface of the waveguide 40A becomes the parabolic surface.

On the multilevel interconnection layer 36 including the waveguide 40A, a color filter 43 of a given color 43 is formed through a passivation film 41 and the planarization film 42. Further on the color filter 43, a lens, specifically, a micro lens 44 called an on-chip lens is provided. The above components constitute the unit pixel 20 having the waveguide 40A which introduces light incident through the micro lens 44 to the light receiving surface of the photoelectric conversion portion 32.

Figure 4:
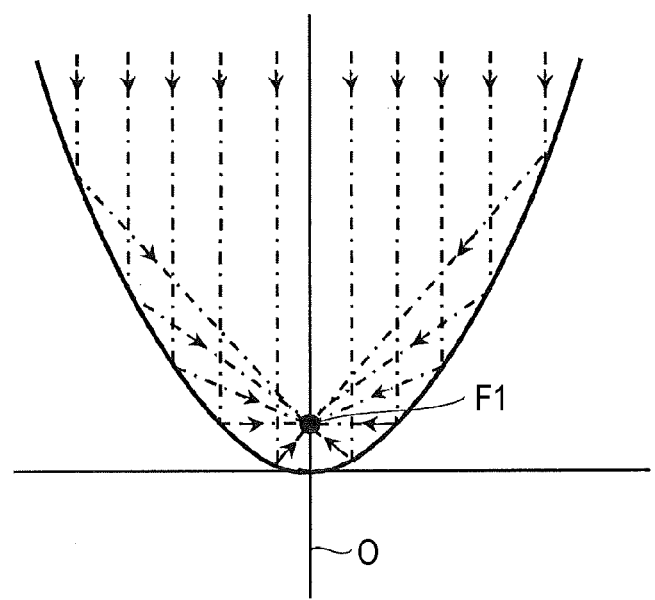
FIG. 4 is a view showing a state in which light entering in parallel to a symmetry axis "0" of a parabola is condensed to a focal point F1 of the parabola.

In the pixel including the waveguide 40A having the above configuration, the parabolic surface forming the inner surface of the waveguide 40A is a kind of a quadratic curve surface. It is known that light (parallel light) entering in parallel to a symmetry axis "O" of a parabola which is a cross section of the parabolic surface is condensed to a focal point F1 of the parabola as shown in FIG. 4. A feature of the embodiment is a point in which the shape of the parabola is used in the inner surface of the waveguide 40A by utilizing the principle of the parabola.

The waveguide 40A is preferably provided so that the central axis of the waveguide 40A corresponding to the symmetry axis "O" of the parabola corresponds to one light ray passing through the center of the micro lens 44, namely, a main light ray P. The lens has a surface which is rotational symmetry around one axis, and the rotational symmetry axis will be an optical axis. A point where the rotational symmetry axis and a lens sphere cross each other will be the center of the micro lens 44.

The waveguide 40A according to the embodiment is formed so that the focal point F1 in the parabola is positioned on, for example, the light receiving surface of the photoelectric conversion portion 32 (interface of the photodiode 21). The position of the focal point F1 in the parabola is not limited to the light receiving surface of the photoelectric conversion portion 32.

As described above, the inner surface of the waveguide 40A is made to be the parabolic surface, thereby condensing light on the light receiving surface of the photoelectric conversion portion 32, which has not been condensed on the light receiving surface of the photoelectric conversion portion 32 by the micro lens 44, particularly, light (parallel light) incident in parallel to the central axis (optical axis) P of the waveguide 40A. Therefore, the light condensing efficiency can be improved as compared with the structure in related art which has a tapered shape at the inner surface, in which light reflected in the waveguide could not be condensed on the light receiving surface of the photoelectric conversion portion 32.

When the distance between pixels is reduced especially along with miniaturization of the pixel size in recent years, in the waveguide structure in related art which has the waveguide structure of the tapered shape at the inner surface, light transmitted through the waveguide is incident on the photoelectric conversion portion of an adjacent pixel and photoelectrically converted in the adjacent pixels, which will be part of the reason for color mixture. On the other hand, in the waveguide structure according to the embodiment, light incident on the waveguide 40A can be efficiently condensed on the light receiving surface of the photoelectric conversion portion 32, therefore, color mixture caused by light transmitted through the waveguide 40A can be prevented.

The above structure can further condense light parallel to the optical axis P on the light receiving surface of the photoelectric conversion portion 32, therefore, the structure can be applied to a pixel structure not having the micro lens 44. Moreover, since the inner surface of the waveguide 40A is the parabolic surface, the size of the planer shape seen from the light incident direction is larger on the side of the micro lens 44 than on the side of the photoelectric conversion portion 32. Therefore, the structure has an advantage in which light transmitted through the micro lens 44 can be taken more into the waveguide 40A as compared with the waveguide structure having, for example, a cylindrical shape.

The embodiment has the waveguide structure in which the focal point F1 in the parabola is positioned on the light receiving surface of the photoelectric conversion portion 32, however, the position of the focal point F1 in the optical axis direction can be optionally set according to design. There is no problem on the photoelectric conversion if the position of the focal point F1 of the parabola is below the light receiving surface (interface) of the photoelectric conversion portion 32, therefore, it is possible to take more margin concerning the position of the focal point F1 as well as to condense light other than the parallel light on the light receiving surface of the photoelectric conversion portion 32.

Furthermore, the position of the focal point F1 can be changed according to colors, namely, red light, green light and blue light. According to this, light condensing upon considering more efficient photoelectric conversion according to colors can be realized. Specifically, a region in which more efficient photoelectric conversion can be performed (photoelectric conversion region) in the photoelectric conversion portion 32 differs according to wavelengths of light. Concerning the photoelectric conversion region in the photoelectric conversion portion 32, the region of the blue light is the shallowest and the region of the red light is the deepest.

Therefore, the position (depth) of the focal point F1 from the light receiving surface (interface) of the photoelectric conversion portion 32 is set so as to be deeper in the order of blue light, green light and red light. According to this, the light condensing upon considering more efficient photoelectric conversion can be realized according to respective colors of red light, green light and blue light. The waveguide structure in related art including the waveguide structure having the tapered shape at the inner surface is made only by considering the condensing of incident light on the light receiving surface, not having the structure suitable to respective colors in view of the photoelectric conversion efficiency.

The size of a beam spot condensed to the focal point F1 can be optionally set by changing, for example, curvature of the parabolic surface. Even when the size of the beam spot is changed, the light amount is not changed. Therefore, the beam spot can be reliably applied to the light receiving surface by reducing the size of the beam spot, for example, even when the light receiving surface of the photoelectric conversion portion 32 is reduced along with the miniaturization of the pixel size in recent years.

The size of the beam spot can be changed according to respective colors of red light, green light and blue light. The size of the beam sport is changed according to respective colors, thereby aiming at the photoelectric conversion region optimum for each color when applying the beam spot even if the photoelectric conversion region in the photoelectric conversion portion 32 differs according to respective colors as described above. As a result, more efficient photoelectric conversion according to respective colors of red light, green light and blue light can be realized. Moreover, since the beam spot can be reduced, the beam spot can be applied to the photoelectric conversion region while avoiding obstacles.

[Manufacturing Method]

Figure 5:
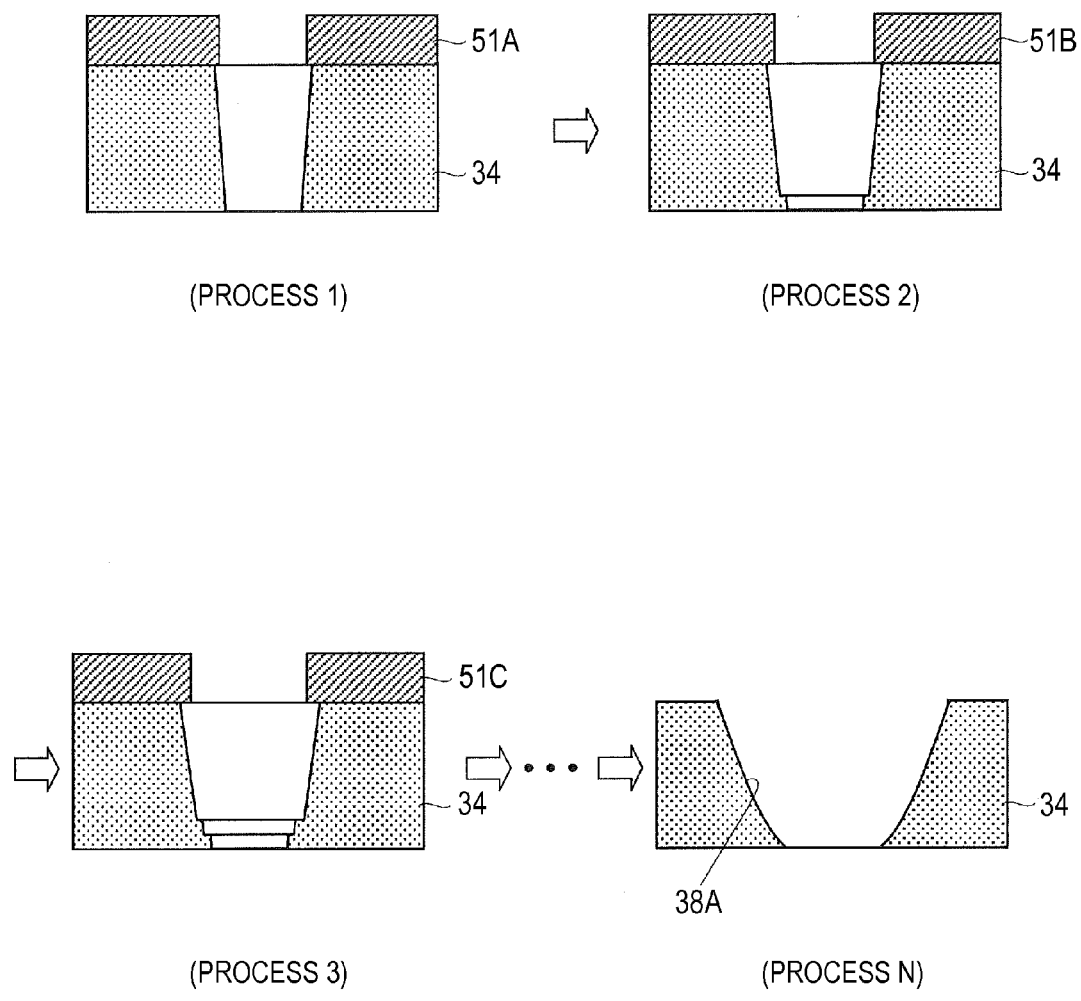
FIG. 5 shows process drawings showing an example of a manufacturing method of the waveguide structure according to the first embodiment.

Subsequently, an example of processes in a manufacturing method concerning pixels having the waveguide structure according to the above first embodiment will be explained with reference to process drawings in FIG. 5. In order to make understanding easier, the same signs are given in FIG. 5 to the same components as components of FIG. 3.

Here, processes of the waveguide structure according to the first embodiment, namely, processes of forming the waveguide 40A in the interlayer insulating film 34 of FIG. 3 will be explained. Known processes can be used for processes before and after the processes of forming the waveguide structure.

Processes in which the aspect ratio differs in the front half and the latter half are used in the course of processes of forming the hole 38A for the waveguide. Furthermore, etching is performed repeatedly while changing power of an etching gas, thereby forming the inner surface of the convex hole 38A as described below.

Specifically, as tangents of the parabola are straight lines, etching is performed by using a photoresist 51A having a hole size corresponding to a bottom surface of the hole for waveguide 38A (Process 1). Next, etching is performed by using a photoresist 51B having a hole size larger than the hole size of the photoresist 51A (Process 2). Subsequently, etching is performed by using a photoresist 51C having a hole size further larger than the hole size of the photoresist 51B (Process 3).

As explained above, processes of performing etching by gradually increasing the hole size (in stages or continuously) while allowing the photoresist 51 to move back will be repeatedly executed the number of times enough to form the parabolic surface in plural stages. According to this, the hole for waveguide 38A having the parabolic surface at the inner surface is eventually formed (Process N). In the etching processes, etching proceeds not only in the transversal direction but also in the depth direction, therefore, the etching surface can be deformed into an arbitrary shape by increasing the number of times of etching and changing power of the etching gas.

3. Second Embodiment

[Pixel Structure]

Figure 6:
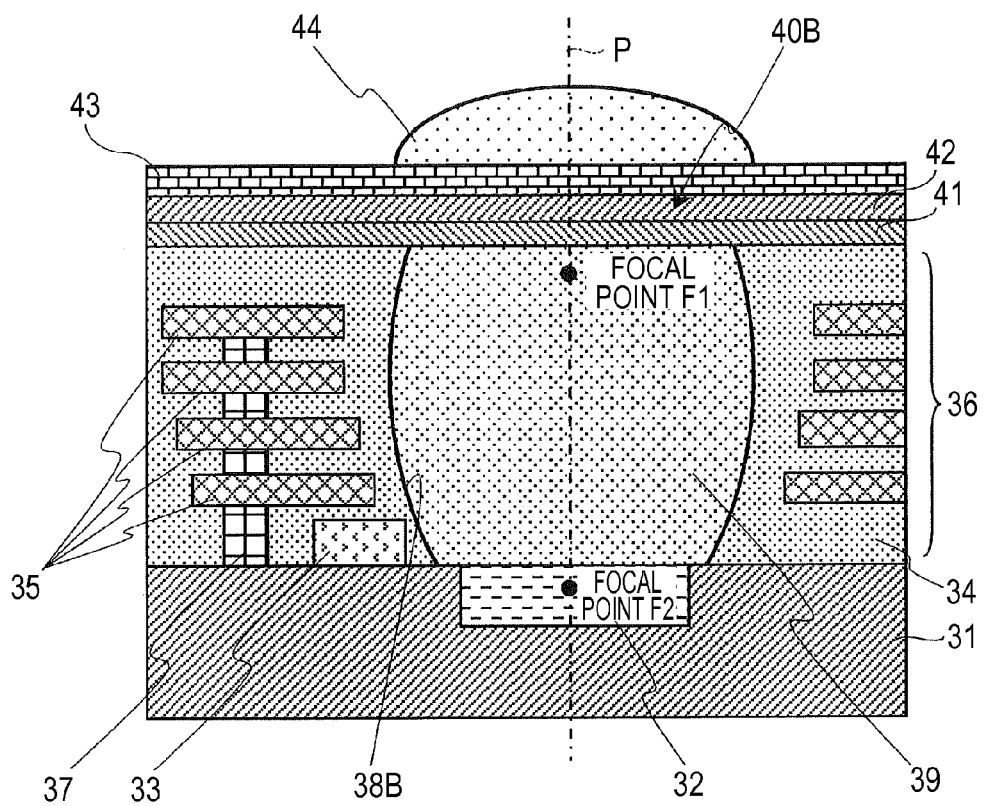
FIG. 6 is a cross-sectional view showing a cross-sectional structure of a pixel including a waveguide structure according to a second embodiment of the invention.

FIG. 6 is a cross-sectional view showing a cross-sectional structure of a pixel including a waveguide structure according to a second embodiment of the invention, and the same signs are given in the drawing to the same components of FIG. 3.

In FIG. 6, a photoelectric conversion portion 32 which photoelectrically converts incident light is formed on a surface layer portion of a silicon substrate 31. The photoelectric conversion portion 32 is formed as a diode (corresponding to the photodiode 21 in FIG. 2) including, for example, a P-type diffusion layer and an N-type diffusion layer on the substrate surface side of the P-type diffusion layer. The photoelectric conversion portion 32 may have a structure in which the surface thereof is further covered by a hole accumulation layer including the P-type diffusion layer.

A gate electrode 33 of the pixel transistor such as the transfer transistor 22 is formed through a base insulating film (not shown) and an interlayer insulating film 34 is deposited on the silicon substrate 31. On the surface side of the interlayer insulating film 34, wirings 35 are formed by burying a conductive material in groove patterns. The deposition of the interlayer insulating film 34 and the formation of wiring 35 into groove patterns are repeated, then, the interlayer insulating film 34 is finally formed to thereby form a multilevel interconnection layer 36.

In the multilevel interconnection layer 36, the wirings 35 at respective layers are electrically connected through a contact portion 37 appropriately. At a portion above the photoelectric conversion portion 32 in the multilevel interconnection layer 36, a hole for the waveguide 38B is formed with an elliptical surface. A light transmissive buried layer (transparent film) 39 is buried inside the hole 38B to form a waveguide 40B. Here, the waveguide 40B is formed by the transmissive buried layer 39 being buried in the hole 38B formed with the elliptical surface, therefore, an inner surface of the waveguide 40B becomes the elliptical surface.

On the multilevel interconnection layer 36 including the waveguide 40B, a color filter of a given color 43 is formed through a passivation film 41 and the planarization film 42. Further on the color filter 43, a micro lens 44 is provided. The above components constitute the unit pixel 20 having the waveguide 40B which introduces light incident through the micro lens 44 to the light receiving surface of the photoelectric conversion portion 32.

Figure 7:
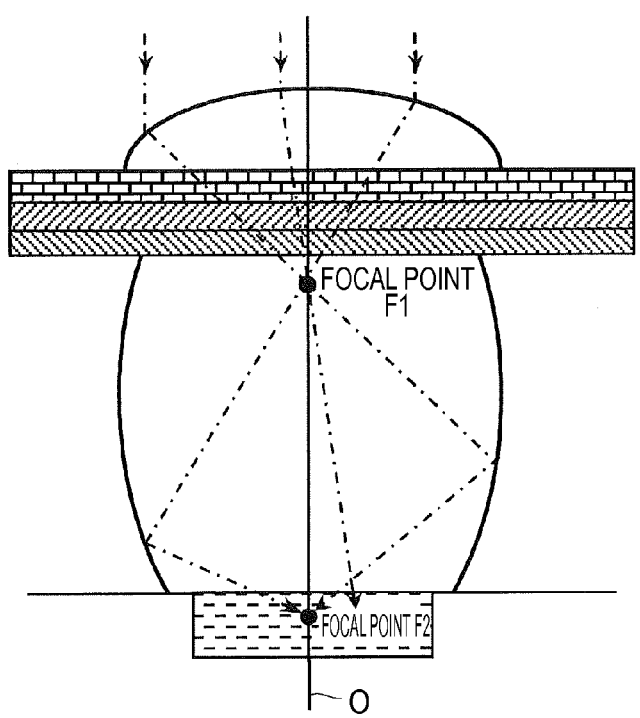
FIG. 7 is a view showing a state in which light passing through a focal point F1 is condensed to a focal point F2 in an ellipse.

In the pixel including the waveguide 40B having the above configuration, the elliptical surface forming the inner surface of the waveguide 40B is a kind of a quadratic curve surface. It is known that light transmitted through a focal point F1 is condensed to a focal point F2 in an ellipse which is a cross section of the elliptical surface as shown in FIG. 7. A feature of the embodiment is a point in which the shape of the ellipse is used in the inner surface of the waveguide 40B by utilizing the principle of the ellipse.

The waveguide 40B is preferably provided so that the focal point F1 positioned on the central axis of the waveguide 40B corresponding to the symmetry axis "O" of the ellipse is positioned at on a main light ray P passing through the center of the micro lens 44. The main light ray P indicates one light ray passing through the center of the micro lens 44, namely, a point where the rotational symmetry axis of the micro lens 44 and a lens sphere cross each other as described above. The micro lens 44 condenses incident light to the focal point F1 (focal point F1 of the ellipse) of the waveguide 40B.

There is no problem on the photoelectric conversion whether the focal point F2 (focal point F2 of the ellipse) of the waveguide 40B is positioned on the light receiving surface (interface) of the photoelectric conversion portion 32 or whether it is positioned below the light receiving surface of the photoelectric conversion portion 32 in the same manner as the first embodiment. Moreover, the position of the focal point F2 can be changed according to colors, namely, red light, green light and blue light, thereby realizing light condensing upon considering more efficient photoelectric conversion according to colors.

The size of the beam spot condensed to the focal point F2 can be changed according to colors in the same manner as the first embodiment, thereby realizing more efficient photoelectric conversion according to respective colors in the photoelectric conversion portion 32.

As described above, the inner surface of the waveguide 40B is made to be the elliptical surface, thereby condensing light condensed by the micro lens 44 and passes through the focal point F1 on the light receiving surface of the photoelectric conversion portion 32 or on the focal point F2 positioned below the light receiving surface. Therefore, the light condensing efficiency can be improved as compared with the waveguide structure in related art including the waveguide structure having the tapered shape at the inner surface.

[Pupil Correction]

The waveguide 40B according to the embodiment is particularly suitable for being applied to a CMOS image sensor using a known technique called a pupil correction which is generally used to a thin-type camera lens an exit pupil distance of which is short for the purpose of alleviating the decrease in the peripheral light amount.

The pupil correction is a technique as described below. First, in the central portion of the pixel array unit 11 to be an imaging surface, the center of the micro lens 44 taking light incident on the pixel 20 individually is allowed to be aligned with the center of an aperture of the photoelectric conversion portion 32 (namely, a region barycenter of the photoelectric conversion portion 32). On the other hand, in the peripheral portion of the pixel array unit 11, the central position of the micro lens 44 is shifted (an offset is provided) with respect to the center of the aperture of the photoelectric conversion portion 32 so as to correspond to the direction of the main optical ray toward the outside. Here, the main light ray indicates one light ray passing through the center of the micro lens 44 as described above.

In short, the technique of providing an offset between the center of the micro lens 44 and the aperture center of the photoelectric conversion portion 32 in the peripheral portion of the pixel array unit 11 is called the pupil correction. Using the technique of the pupil correction allows the camera lens to be thinner and prevents vignetting of light at the aperture periphery of the photoelectric conversion portion 32 even if incident light to the micro lens 44 enters the imaging surface at various angles. According to this, light condensing efficiency of respective pixels 20 can be approximately constant all over the pixel array unit 11 (entire imaging surface), therefore, comprehensive performance improvement in sensitivity can be realized.

In the CMOS image sensor using the technique of the pupil correction, the offset is generated between the center of the micro lens 44 and the aperture center of the photoelectric conversion portion 32 at the peripheral portion of the pixel array unit 11 as described above. Then, in the waveguide structure in related art including the waveguide structure having the tapered shape at the inner surface, it is highly likely that light reflected in the waveguide deviates from the light receiving surface of the photoelectric conversion portion 32 to a large degree, which leads to the reduction of sensitivity and shading.

Figure 8:
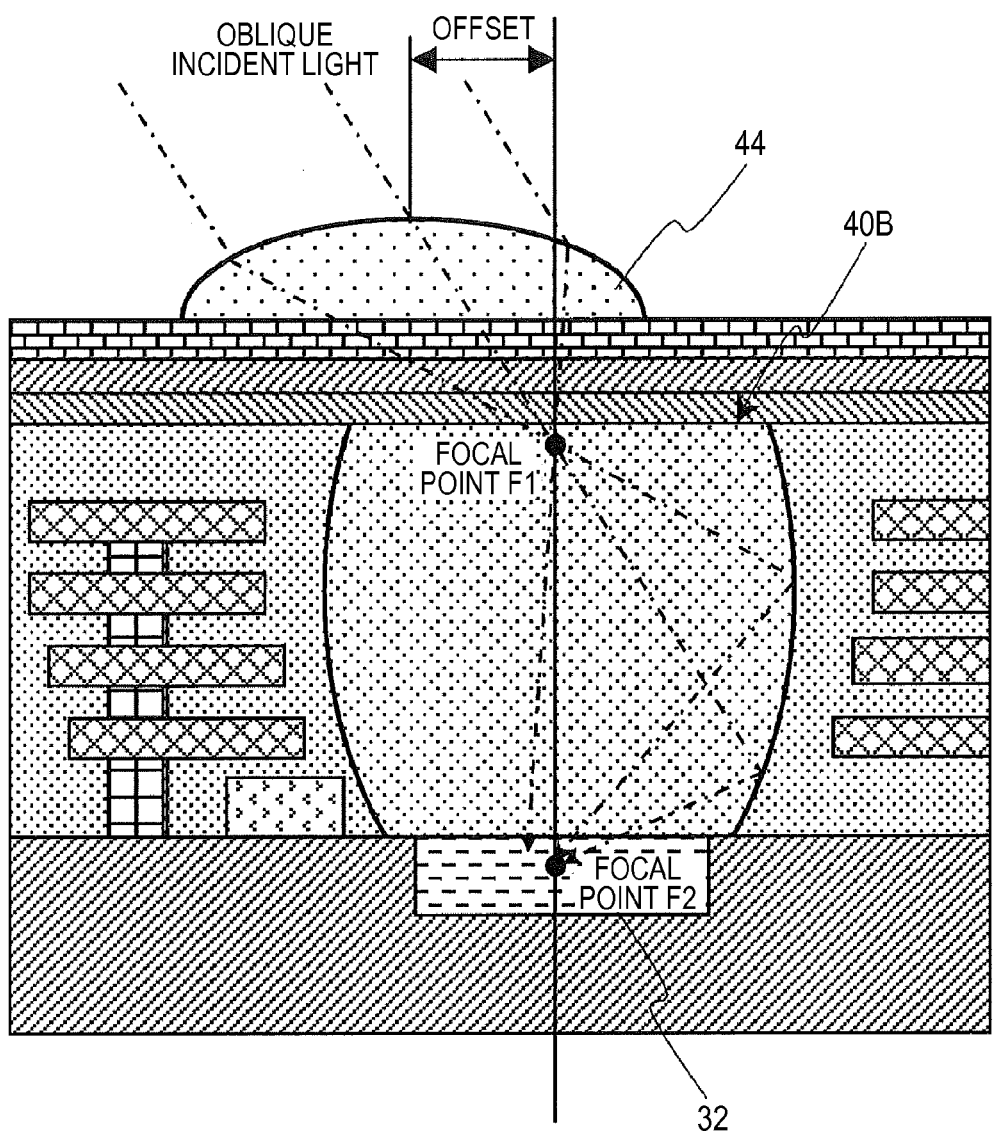
FIG. 8 is a cross-sectional view showing a case in which the waveguide structure according to the second embodiment is applied to the CMOS image sensor using a pupil correction technique.

On the other hand, in the CMOS image sensor using the technique of the pupil correction, the light condensing efficiency can be increased by using the waveguide structure according to the embodiment, namely, the waveguide structure in which the inner surface of the waveguide 40B is an elliptical surface as the waveguide structure of pixels at the peripheral portion of the pixel array unit 11. Specifically, light incident on pixels obliquely is condensed to the focal point F1 by the micro lens 44 as shown in FIG. 8, thereby efficiently condensing light passing through the focal point F1 to the photoelectric conversion portion 32. Therefore, the sensitivity can be improved as compared with the waveguide structure in related art and shading can be prevented.

[Manufacturing Method]

Figure 9:
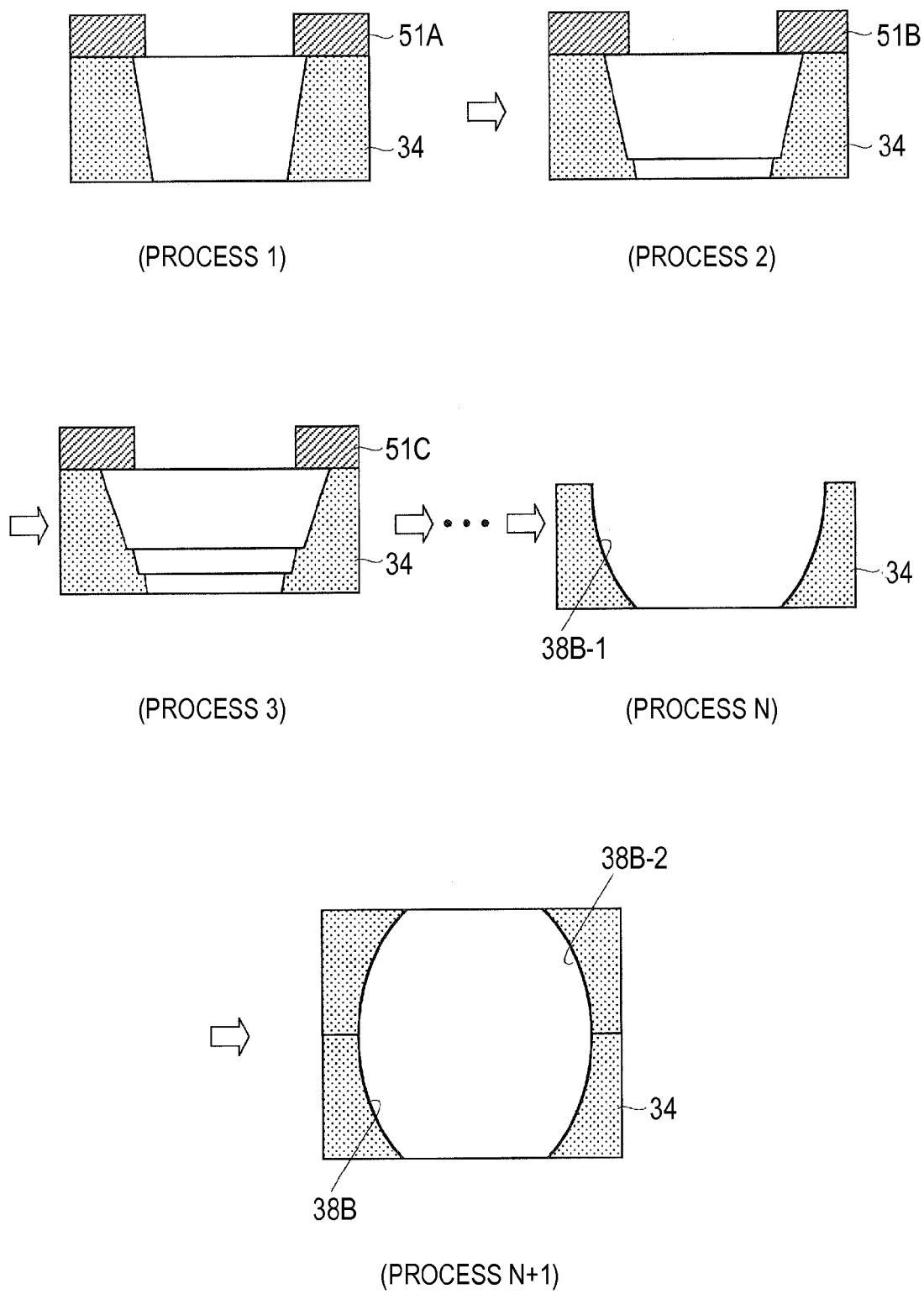
FIG. 9 shows process drawings showing an example of a manufacturing method of the waveguide structure according to the second embodiment.

Subsequently, an example of processes in a manufacturing method concerning pixels having the waveguide structure according to the above second embodiment will be explained with reference to process drawings of FIG. 9. In order to make understanding easier, the same signs are given in FIG. 9 to the same components as components of FIG. 6.

Here, processes of the waveguide structure according to the second embodiment, namely, processes of forming the waveguide 40B in the interlayer insulating film 34 of FIG. 6 will be explained. Known processes can be used for processes before and after the processes of forming the waveguide structure.

As processes of forming the hole for the waveguide 38B, the same processes as processes of forming the hole for the waveguide 38A in the case of the above first embodiment are basically used in the present example. Specifically, etching is performed by using a photoresist 51A having a hole size corresponding to a bottom surface of the hole for waveguide 38B (Process 1). Next, etching is performed by using a photoresist 51B having a hole size larger than the hole size of the photoresist 51A (Process 2).

Subsequently, etching is performed by using a photoresist 51C having a hole size further larger than the hole size of the photoresist 51B (Process 3). Accordingly, etching is performed by gradually increasing the hole size (in stages or continuously) while allowing the photoresist 51 to move back. These processes are repeatedly executed the number of times enough to form the half of the elliptical surface in plural stages, thereby forming a semi-elliptical surface 38B-1 at the lower side of the hole for the waveguide 38B having the elliptical inner surface (Process N).

Next, a semi-elliptical surface 38B-2 at the upper side is formed by the same processes (Process 1 to Process N). In the etching processes, etching proceeds not only in the transversal direction but also in the depth direction, therefore, the etching surface can be deformed into an arbitrary shape by increasing the number of times of etching and changing power of the etching gas.

Then, a substrate in which the upper-side semi-elliptical surface 38B-2 is formed is bonded in an upside-down state to a substrate in which the lower-side semi-elliptical surface 38B-1 is formed, thereby eventually forming the hole for the waveguide 38B having the elliptical surface at the inner surface (Process N+1). As a technique of bonding two substrates, a known technique used in a back-illuminated image sensor can be used. The bonding of the two substrates can be performed by using, for example, a SOI (Silicon On Insulator) substrate.

4. Modification Example

In the above respective embodiments, the cases of the waveguide structures in which the holes for the waveguide 38A, 38B are formed in the interlayer insulating film 34 and the light transmissive buried layer 39 is buried into these holes 38A, 38B have been explained as examples, however, the present invention is not limited to the application to the waveguide structure. For example, it is possible to apply the technique of making the inner surfaces of the holes for the waveguide 38A, 38B be the quadratic curve surface also with respect to the waveguide structure in which a metal film is formed at the inner surfaces of the holes for the waveguide 38A, 38B and light is reflected by the metal film.

Also in the above respective embodiments, the cases of application to the CMOS image sensor have been explained as examples, however, it is not limited to the application to the CMOS image sensor. That is, the invention can be applied to all X-Y address type solid-state imaging devices in which unit pixels detecting charges corresponding to the light amount of visible light as the physical quantity and outputs them as electrical signals are arranged in a matrix state. The invention can be further applied to a charge-transfer type solid-state imaging device typified by a CCD (Charge Coupled Device) image sensor, not limited to the X-Y address type solid-state imaging device.

The solid-state imaging device may be formed as one chip, or may be formed as a module mode having an imaging function in which an imaging unit and a signal processing unit or an optical system are integrally packaged.

5. Electronic Apparatus

The invention is not limited to the application to the solid-state imaging device but can be applied to electronic apparatuses such as an imaging apparatus. Here, electronic apparatuses indicate imaging apparatuses (camera systems) such as a digital still camera and a video camera, mobile devices such as a cellular phone and a PDA (Personal Digital Assistant) having an imaging function. The module mode to be mounted on the electronic apparatus, namely, a camera module is dealt as the imaging apparatus.

[Imaging Apparatus]

FIG. 10 is a block diagram showing a configuration example of an imaging apparatus as an example of an electronic apparatus according to an embodiment of the invention. As shown in FIG. 10, an imaging apparatus 100 according to the embodiment has an optical system including a lens group 101 and the like, an imaging device 102, a DSP circuit 103 which is a camera signal processing unit, a frame memory 104, a display device 105, a recording device 106, an operation system 107, a power supply system 108 and the like. The DSP circuit 103, the frame memory 104, the display device 105, the recording device 106, the operation system 107 and the power supply system 108 are mutually connected through a bus line 109.

The lens group 101 takes incident light (image light) from a subject and brings light into focus on an imaging surface of the imaging device 102. The imaging device 102 converts the light amount of incident light focused on the imaging surface by the lens group 101 into electrical signals in respective pixels and outputs the signals as pixel signals. As the imaging device 102, the CMOS image sensor in which plural pixels having the waveguide structure according to the first and second embodiments are arranged is used.

The display device 105 includes a panel-type display device such as a liquid crystal display device and an organic EL (electro luminescence) display device, displaying moving pictures or still pictures imaged by the imaging device 102. The recording device 106 records moving pictures or still pictures imaged by the imaging device 102 in recording media such as a video tape and a DVD (Digital Versatile Disk).

The operation system 107 issues operation commands of various functions included in the imaging apparatus under the control by a user. The power supply system 108 appropriately supplies various power supplies to be operation power supplies for the DSP circuit 103, the frame memory 104, the display device 105, the recording device 106 and the operation system 107 to these supply targets.

The imaging device 100 is applied to a video camera or a digital still camera, and camera modules for mobile devices such as a cellular phone. In the imaging apparatus 100, the CMOS image sensor according to the first and second embodiments is used as the imaging device 102, thereby improving light condensing efficiency of the CMOS image sensor and improving the sensitivity, as a result, the imaging apparatus having excellent image quality can be provided. Since the miniatulization of the pixel size can be realized due to the improvement of the sensitivity, therefore, high-definition imaged pictures corresponding to the increase of pixels can be provided.

The present application contains subject matter related to that disclosed in Japanese Priority Patent Application JP 2009-050132 filed in the Japan Patent Office on Mar. 4, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
plural unit pixels including
a photoelectric conversion portion converting incident light into an electrical signal, and
a waveguide having a quadratic curve surface at an inner surface and introducing the incident light to the photoelectric conversion portion,
wherein the quadratic curve surface is an elliptical surface.

2. The solid-state imaging device according to claim 1, wherein the unit pixel includes a micro lens taking the incident light, and
the micro lens condenses the incident light to one focal point of the elliptical surface.

3. The solid-state imaging device according to claim 2, wherein the center of the micro lens is arranged with an offset with respect to the aperture center of the photoelectric conversion portion.

4. The solid-state imaging device according to claim 1, wherein the unit pixel includes a color filter, and
a position of the focal point of the parabolic surface or the other focal point of the elliptical surface in an optical axis direction differs according to colors of the color filter.

5. The solid-state imaging device according to claim 1, wherein the unit pixel includes a color filter, and
a spot size of light condensed to the focal point of the parabolic surface or the other focal point of the elliptical surface differs according to colors of the color filter.

* * * * *